(12) United States Patent
Ritter et al.

(10) Patent No.: US 8,045,319 B2
(45) Date of Patent: Oct. 25, 2011

(54) CONTROLLED ESR DECOUPLING CAPACITOR

(75) Inventors: Andrew P. Ritter, Surfside Beach, SC (US); Marianne Berolini, Southport, NC (US); Kimberly L. VanAlstine, Murrells Inlet, SC (US)

(73) Assignee: AVX Corporation, Fountain Inn, SC (US)

( * ) Notice: Subject to any disclaimer, the term of this patent is extended or adjusted under 35 U.S.C. 154(b) by 748 days.

(21) Appl. No.: 12/135,536

(22) Filed: Jun. 9, 2008

(65) Prior Publication Data

US 2008/0310076 A1     Dec. 18, 2008

Related U.S. Application Data

(60) Provisional application No. 60/934,397, filed on Jun. 13, 2007.

(51) Int. Cl.
  *H01G 4/005*   (2006.01)
  *H01G 4/228*   (2006.01)
  *H01G 4/06*   (2006.01)
(52) U.S. Cl. .................. 361/303; 361/306.3; 361/321.2
(58) Field of Classification Search .............. 361/303, 361/321.2, 306.3
See application file for complete search history.

(56) References Cited

U.S. PATENT DOCUMENTS

| | | |
|---|---|---|
| 3,444,436 A | 5/1969 | Coda |
| 4,831,494 A | 5/1989 | Arnold et al. |
| 5,517,385 A | 5/1996 | Galvagni et al. |
| 6,243,253 B1 | 6/2001 | DuPre et al. |
| 6,292,351 B1 | 9/2001 | Ahiko et al. |
| 6,483,692 B2 | 11/2002 | Figueroa et al. |
| 6,576,497 B2 | 6/2003 | Ahiko et al. |
| 6,606,237 B1 | 8/2003 | Naito et al. |
| 6,661,640 B2 | 12/2003 | Togashi |
| 6,757,152 B2 | 6/2004 | Galvagni et al. |
| 6,822,847 B2 | 11/2004 | Devoe et al. |
| 6,885,544 B2 | 4/2005 | Kim et al. |
| 6,917,510 B1 | 7/2005 | Prymak |
| 6,960,366 B2 * | 11/2005 | Ritter et al. ............ 427/79 |
| 7,054,136 B2 | 5/2006 | Ritter et al. |
| 7,280,342 B1 * | 10/2007 | Randall et al. ............ 361/303 |
| 7,741,670 B2 * | 6/2010 | Pan ............ 257/306 |
| 2004/0184202 A1 | 9/2004 | Togashi et al. |
| 2005/0047059 A1 | 3/2005 | Togashi |

* cited by examiner

*Primary Examiner* — Jayprakash N Gandhi
*Assistant Examiner* — Arun Ramaswamy
(74) *Attorney, Agent, or Firm* — Dority & Manning, P.A.

(57) ABSTRACT

Disclosed are apparatus and methodology for providing controlled equivalent series resistance (ESR) decoupling capacitor designs having broad applicability to signal and power filtering technologies. Such capacitor designs provide characteristics for use in decoupling applications involving both signal level and power level environments. Controlled equivalent series resistance (ESR) is provided by providing extended length tab connections to active electrode layers within the device.

50 Claims, 6 Drawing Sheets

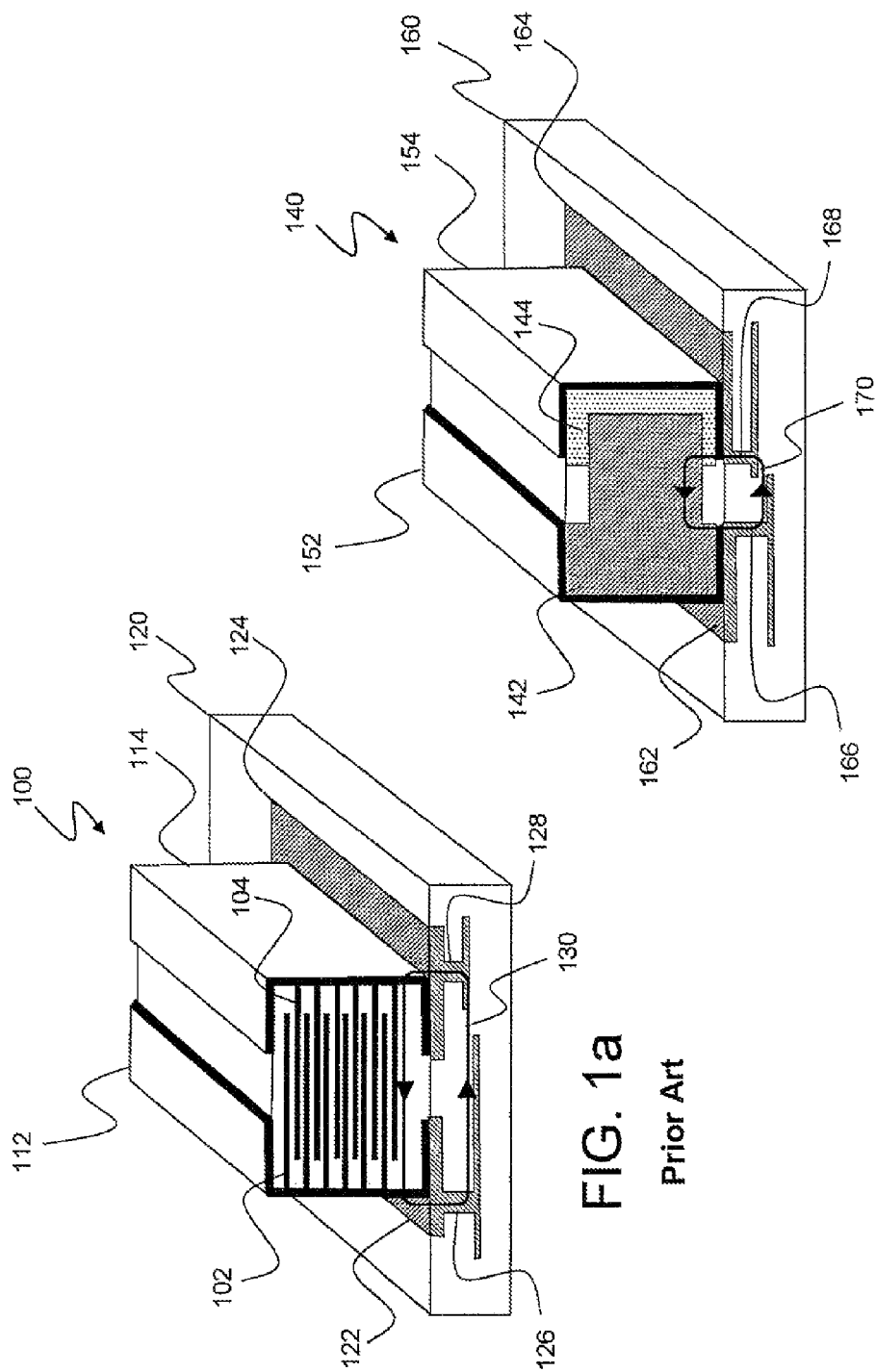

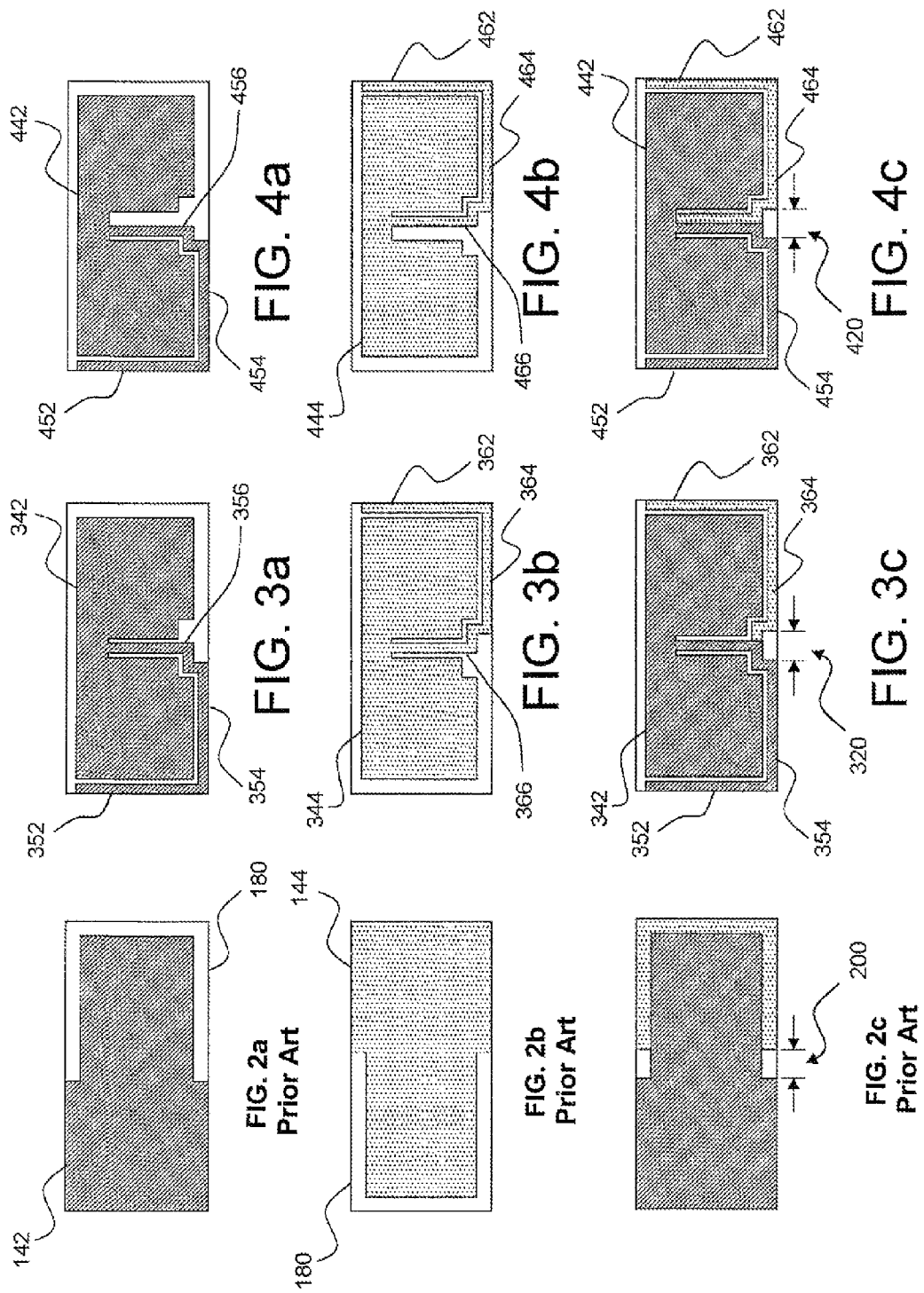

CONTROLLED ESR DECOUPLING CAPACITOR

PRIORITY CLAIM

This application claims the benefit of previously filed U.S. Provisional Patent Application entitled "CONTROLLED ESR DECOUPLING CAPACITOR," assigned U.S. Ser. No. 60/934,397, filed Jun. 13, 2007, and which is incorporated herein by reference for all purposes.

FIELD OF THE INVENTION

The present subject mater relates to capacitors. More particularly, the present subject matter relates to vertically oriented, multi-layer ceramic capacitor structures having broad applicability to signal and power filtering technologies.

BACKGROUND OF THE INVENTION

The present subject matter generally concerns improved component design for decoupling capacitors that generally results in devices characterized by relatively low cost, low inductance and controllable Equivalent Series Resistance (ESR).

As switching speeds increase and pulse rise times decrease in electronic circuit applications, the need to reduce inductance becomes a serious limitation for improved system performance. Even the decoupling capacitors, which act as a local energy source, can generate unacceptable voltage spikes, as reflected by the calculation of V=L (di/dt). Thus, in high speed circuits where di/dt can be quite large, the size of the potential voltage spikes can only be reduced by reducing the inductance value L.

The prior art includes several strategies for reducing equivalent series inductance, or ESL, of chip capacitors compared to standard multilayer chip capacitors. A first exemplary strategy involves reverse geometry termination, such as employed in low inductance chip capacitor (LICC) designs such as manufactured and sold by AVX Corporation. In LICCs, electrodes are terminated on the long side of a chip instead of the short side. Since the total inductance of a chip capacitor is determined in part by its length to width ratio, LICC reverse geometry termination results in a reduction in inductance by as much as a factor of six from conventional MLC chips.

Interdigitated capacitors (IDCs) incorporate a second known strategy for reducing capacitor inductance. IDCs incorporate electrodes having a main portion and multiple tab portions that connect to respective terminations formed on the capacitor periphery. Multiple such terminations can help reduce the parasitic inductance of a device. Examples of interdigitated capacitors are disclosed in U.S. Pat. No. 6,243,253 (DuPre et al.)

A still further known technology utilized for reduction in capacitor inductance involves designing alternative current paths to minimize the mutual inductance factor of capacitor electrodes. A low inductance chip array product, such as manufactured and sold by AVX Corporation under the LICA® brand, minimizes mutual inductance by configuring a ball grid array multilayer capacitor such that the charging current flowing out of a positive plate returns in the opposite direction along an adjacent negative plate. Utilization of LICA® brand technology achieves low inductance values by low aspect ratio of the electrodes, an arrangement of electrode tabs so as to cancel inductance and vertical aspect of the electrodes to the mounting surface.

Additional references that incorporate adjacent electrodes having reverse current paths used to minimize inductance include U.S. Published Patent Application No. 2005/0047059 (Togashi et al.) and U.S. Pat. No. 6,292,351 (Ahiko et al.). Both such references also utilize a vertical aspect of electrodes relative to a mounting surface. Additional references that disclose electrodes for use in a vertically-oriented position include U.S. Pat. No. 5,517,385 (Galvagni et al.); U.S. Pat. No. 4,831,494 (Arnold et al.); and U.S. Pat. No. 6,885,544 (Kim et al.).

A known reference that discloses features aimed to reduce inductance in an integrated circuit package that includes a capacitive device is U.S. Pat. No. 6,483,692 (Figueroa et al.). Such reference recognizes that inductance relates to circuit board "loop area" or the electrical distance (or span) that current must follow. It is desirable in Figeuroa et al. to minimize such loop area, thus reducing the inductance levels. Extended surface lands are also provided in Figueroa et al., providing a larger surface area that is said to result in more reliable connections characterized by reduced inductance and resistance levels.

U.S. Pat. No. 6,661,640 (Togashi) also discloses features for reducing ESL of a decoupling capacitor by maximizing the surface area of device terminations. U.S. Pat. No. 6,917,510 (Prymak) discloses a capacitor embodiment with terminal extensions formed to result in a narrow gap between the electrodes. The end electrodes of U.S. Pat. No. 6,822,847 (Devoe et al.) also cover all but a thin separation line at a central portion of the capacitor body. U.S. Pat. No. 7,054,136 (Ritter et al.) discloses a low inductance controlled equivalent series resistance multilayer ceramic capacitor providing controlled amounts of resistive material in the terminations.

Still further known references that include features for reducing component inductance correspond to U.S. Pat. No. 6,757,152 (Galvagni et al.) and U.S. Pat. No. 6,606,237 (Naito et al.), in which conductive vias are utilized to form generally low inductance connections to upper electrodes in a multilayer capacitor.

Additional background references that may address certain aspects of low-inductance multilayer electronic devices include U.S. Pat. No. 6,576,497 (Ahiko et al.) and U.S. Pat. No. 3,444,436 (Coda) as well as U.S. Published Patent Application No. 2004/0184202 (Togashi et al.).

The disclosures of all the foregoing United States patents and published patent applications are hereby fully incorporated into this application for all purposes by virtue of present reference thereto.

While various aspects and alternative features are known in the field of multilayer electronic components and related methods for manufacture, no one design has emerged that generally addresses all of the issues as discussed herein.

SUMMARY OF THE INVENTION

In view of the recognized features encountered in the prior art and addressed by the present subject matter, improved apparatus and methodology for controlling equivalent series resistance (ESR) in a multi-layer ceramic capacitor has been developed.

In an exemplary configuration, vertically oriented capacitor structure is provided that may be sized to provide a wide range of capacitance values and effective filtering capabilities for signal level lines as well as decoupling of power level lines or circuit planes.

In one of their simpler forms, a multi-layer, vertically oriented ceramic capacitor structure is provided that provides a controlled Equivalent Series Resistance (ESR) by employing additional path length to active electrodes to increase ESR.

Another positive aspect of this type of device is that capacitors may be produced in accordance with the present technology resulting in relatively small devices that allow for distributed placement of the devices over a circuit board.

In accordance with aspects of certain embodiments of the present subject matter, methodologies are provided to optimize current cancellation within the device to minimize ESL.

In accordance with certain aspects of other embodiments of the present subject matter, methodologies have been developed to provide land grid feedthrough capacitors having characteristics for decoupling applications.

In accordance with yet additional aspects of further embodiments of the present subject matter, apparatus and accompanying methodologies have been developed to provide vertically oriented devices based on land grid array (LGA) and Fine Copper Termination (FCT) technologies.

According to yet still other aspects of additional embodiments of the present subject matter, apparatus and methodologies have been developed to provide devices with relatively high capacitance values.

One exemplary embodiment in accordance with the present subject matter relates to a multilayer electronic component, comprising a plurality of first electrode layers, each first electrode layer comprising a first insulative layer having first and second surfaces thereof bounded by four edges and a first conductive layer covering a portion of such first surface of such first insulative layer and having a main electrode area and at least one extended length tab connection extending from such first conductive layer main electrode area to at least one edge of such first insulative layer first surface; a plurality of second electrode layers alternately stacked with such plurality of first electrode layers and comprising mirror images thereof, each second electrode layer comprising a second insulative layer having first and second surfaces thereof bounded by four edges and a second conductive layer covering a portion of such first surface of such second insulative layer and having a main electrode area and at least one extended length tab connection extending from such second conductive layer main electrode area to at least one edge of such second insulative layer first surface; first conductive termination layer material covering portions of such first electrode layers and electrically connecting such first conductive layer of each of such plurality of first electrode layers; and second conductive termination layer material covering portions of such second insulative layer and electrically connecting such second conductive layer of each of such plurality of second electrode layers. With such an arrangement, such at least one extended length tab connections of such respective first and second conductive layers are preferably selectively configured so as to selectively establish the effective length of respective paths to such respective conductive layers, whereby a current path is formed from such first conductive termination layer through such plurality of first electrode layers and plurality of second electrode layers to such second conductive termination layer which cooperates with an associated circuit board for forming respective current pathways having controlled equivalent series resistance for such component.

In the foregoing arrangement, preferably at least one of the length, width, and thickness of such at least one extended length tab connections of such respective first and second conductive layers is selectively configured so as to selectively establish the equivalent series resistance for such component.

In other variations of the foregoing exemplary embodiment, such first conductive termination layer material and such second conductive termination layer material may be configured so as to form a gap therebetween along a portion of such at least one edge of both such first and second electrode layers, whereby such current path includes a current loop area formed from such first conductive termination layer through such plurality of first electrode layers and plurality of second electrode layers to such second conductive termination layer which cooperates with an associated circuit board for forming respective current cancellation pathways, for lowering equivalent series inductance of such component. In such exemplary arrangement, preferably such terminal layer material spacing is minimized at such gap so as to provide reduction in equivalent series inductance of such component as such gap is reduced.

In certain of the foregoing exemplary arrangments, such multilayer electronic component may comprise a vertically oriented, multilayer ceramic decoupling capacitor.

In other present variations of the foregoing exemplary embodiment, a circuit board combination may be provided, comprising a multilayer electronic component as in any of the foregoing present examples; a circuit board; a plurality of conductive traces formed on a same side of such circuit board, and configured so as to respectively engage such first conductive termination layer material and such second conductive termination layer material; a first conductive plane formed in such circuit board; a second conductive plane formed in such circuit board; and a plurality of conductive vias formed through such circuit board and configured to couple respectively such respective first and second conductive termination layer materials with such conductive planes formed in such circuit board. In such foregoing examples, such first conductive layer material may comprise one of a power or signal path; and such second conductive layer material may comprise a ground plane.

Another variation of the foregoing exemplary embodiments which may be alternatively practiced is that each such multilayer electronic component may further comprise at least one edge tab portion formed on each of such respective insulative layers and electrically isolated from such main electrode area of such respective first and second conductive layers with which it is associated, and which are selectively configured so as to respectively extend along at least one edge of such insulative layer first surface with which it is associated, each of such tab portions providing an edge nucleation area for formation of termination material thereat.

In certain present exemplary embodiments, a present multilayer electronic component may further comprise at least a second extended length tab connection extending respectively from each of such conductive layer main electrode area to at least one edge of its respective insulative layer first surface, so as provide dual access to each respective conductive layer so as to provide relatively reduced equivalent inductance of such component.

In other present exemplary embodiments of the foregoing multilayer electronic component, such multilayer electronic component may further comprise a vertically oriented, multilayer ceramic dual capacitor decoupling multiple electrode capacitor; each of such first and second electrode layers may further comprise at least two respective edge tab portions formed on each of such respective insulative layers and electrically isolated from such main electrode area of such respective first and second conductive layers with which it is associated, and which are selectively configured so as to respectively extend along at least two edges of such insulative layer first surface with which it is associated, each of such tab portions providing an edge nucleation area for formation of termination material thereat; and such multilayer electronic component may comprise a plurality of respective third and fourth electrode layers, with each third electrode layer comprising a third insulative layer having first and second surfaces thereof bounded by four edges and a third conductive layer covering a portion of such first surface of such third insulative layer and having a main electrode area and at least two extended length tab connections extending from such third conductive layer main electrode area to at least two respective edges of such third insulative layer first surface, and with each of such plurality of fourth electrode layers alternately stacked with such plurality of third electrode layers and comprising mirror images thereof, each fourth electrode layer comprising a fourth insulative layer having first and second surfaces thereof bounded by four edges and a fourth conductive layer covering a portion of such first surface of such fourth insulative layer and having a main electrode area and at least two respective extended length tab connections extending from such fourth conductive layer main electrode area to at least two edges of such fourth insulative layer first surface.

Another present exemplary embodiment relates to a circuit board and electronic component combination, comprising a multilayer land grid feedthrough vertically-oriented ceramic capacitor mounted on a multilayer printed circuit board, for effective filtering capabilities for signal level lines and decoupling of power level lines or circuit planes, and for providing controlled equivalent series resistance of such electronic component. Such exemplary present combination preferably may comprise a plurality of first electrode layers, each first electrode layer comprising a first insulative layer having first and second surfaces thereof bounded by four edges and a first conductive layer covering a portion of such first surface of such first insulative layer and having a main electrode area and at least one extended length tab connection extending from such first conductive layer main electrode area to at least one edge of such first insulative layer first surface; a plurality of second electrode layers alternately stacked with such plurality of first electrode layers and comprising mirror images thereof, each second electrode layer comprising a second insulative layer having first and second surfaces thereof bounded by four edges and a second conductive layer covering a portion of such first surface of such second insulative layer and having a main electrode area and at least one extended length tab connection extending from such second conductive layer main electrode area to at least one edge of such second insulative layer first surface; first conductive termination layer material covering portions of such first electrode layers and electrically connecting such first conductive layer of each of such plurality of first electrode layers; second conductive termination layer material covering portions of such second insulative layer and electrically connecting such second conductive layer of each of such plurality of second electrode layers; a plurality of conductive traces formed on a same side of such circuit board, and configured so as to respectively engage such first conductive termination layer material and such second conductive termination layer material; a first conductive plane formed in such circuit board; a second conductive plane formed in such circuit board; and a plurality of conductive vias formed through such circuit board and configured to couple respectively such respective first and second conductive termination layer materials with such conductive planes formed in such circuit board. In such foregoing exemplary embodiment, preferably such first conductive layer material comprises one of a power or signal path; such second conductive layer material comprises a ground plane; and such at least one extended length tab connections of such respective first and second conductive layers are selectively configured so as to selectively establish the effective length of respective paths to such respective conductive layers, whereby a current path is formed from such first conductive termination layer through such plurality of first electrode layers and plurality of second electrode layers to such second conductive termination layer which cooperates with such circuit board for forming respective current pathways having controlled equivalent series resistance for such component.

Yet another present exemplary embodiment relates to a multilayer land grid feedthrough vertically-oriented ceramic capacitor for mounting on a multilayer printed circuit board, for effective filtering capabilities for signal level lines and decoupling of power level lines or circuit planes, for providing controlled equivalent series resistance, and for providing low equivalent series inductance by employing current canceling techniques. Such present exemplary combination may further include a plurality of first electrode layers, each first electrode layer comprising a first insulative layer having first and second surfaces thereof bounded by four edges and a first conductive layer covering a portion of such first surface of such first insulative layer and having a main electrode area and at least one extended length tab connection extending from such first conductive layer main electrode area to at least one edge of such first insulative layer first surface; a plurality of second electrode layers alternately stacked with such plurality of first electrode layers and comprising mirror images thereof, each second electrode layer comprising a second insulative layer having first and second surfaces thereof bounded by four edges and a second conductive layer covering a portion of such first surface of such second insulative layer and having a main electrode area and at least one extended length tab connection extending from such second conductive layer main electrode area to at least one edge of such second insulative layer first surface; first conductive termination layer material covering portions of such first electrode layers and electrically connecting such first conductive layer of each of such plurality of first electrode layers; and second conductive termination layer material covering portions of such second insulative layer and electrically connecting such second conductive layer of each of such plurality of second electrode layers. In such exemplary embodiment, preferably such at least one extended length tab connections of such respective first and second conductive layers are selectively configured so as to selectively establish the effective length of respective paths to such respective conductive layers, whereby a current path is formed from such first conductive termination layer through such plurality of first electrode layers and plurality of second electrode layers to such second conductive termination layer which cooperates with an associated circuit board for forming respective current pathways having controlled equivalent series resistance for such component; such first conductive termination layer material and such second conductive termination layer material are configured so as to form a gap therebetween along a portion of such at least one edge of both such first and second electrode layers, whereby such current path includes a current loop area formed from such first conductive termination layer through such plurality of first electrode layers and plurality of second electrode layers to such second conductive termination layer which cooperates with an associated circuit board for forming respective current cancellation pathways, for lowering equivalent series inductance of such component; and terminal layer material spacing is minimized at such gap so as to provide reduction in equivalent series inductance of such component as such gap is reduced.

Those of ordinary skill in the art will appreciate from the totality of the present disclosure that the present subject matter equally relates to both apparatus and methodology. One present exemplary method of making a multilayer electronic component may comprise providing a plurality of first electrode layers, each first electrode layer comprising a first insulative layer having first and second surfaces thereof bounded by four edges and a first conductive layer covering a portion of such first surface of such first insulative layer and having a main electrode area and at least one extended length tab connection extending from such first conductive layer main electrode area to at least one edge of such first insulative layer first surface; providing a plurality of second electrode layers comprising mirror images of such plurality of first electrode layers, each second electrode layer comprising a second insulative layer having first and second surfaces thereof bounded by four edges and a second conductive layer covering a portion of such first surface of such second insulative layer and having a main electrode area and at least one extended length tab connection extending from such second conductive layer main electrode area to at least one edge of such second insulative layer first surface; positioning such first and second electrode layers in respective alternating layers; providing first conductive termination layer material covering portions of such first electrode layers and electrically connecting such first conductive layer of each of such plurality of first electrode layers; providing second conductive termination layer material covering portions of such second insulative layer and electrically connecting such second conductive layer of each of such plurality of second electrode layers; and selectively configuring such at least one extended length tab connections of such respective first and second conductive layers so as to selectively establish the effective length of respective paths to such respective conductive layers, so that a current path is formed from such first conductive termination layer through such plurality of first electrode layers and plurality of second electrode layers to such second conductive termination layer which cooperates with an associated circuit board for forming respective current pathways having controlled equivalent series resistance for such component.

Another present exemplary methodology relates to a method of making a circuit board and electronic component combination, comprising a multilayer land grid feedthrough vertically-oriented ceramic capacitor mounted on a multilayer printed circuit board, for effective filtering capabilities for signal level lines and decoupling of power level lines or circuit planes, and for providing controlled equivalent series resistance of such electronic component, such combination comprising providing a plurality of first electrode layers, each first electrode layer comprising a first insulative layer having first and second surfaces thereof bounded by four edges and a first conductive layer covering a portion of such first surface of such first insulative layer and having a main electrode area and at least one extended length tab connection extending from such first conductive layer main electrode area to at least one edge of such first insulative layer first surface; providing a plurality of second electrode layers comprising mirror images of such first electrode layers, each second electrode layer comprising a second insulative layer having first and second surfaces thereof bounded by four edges and a second conductive layer covering a portion of such first surface of such second insulative layer and having a main electrode area and at least one extended length tab connection extending from such second conductive layer main electrode area to at least one edge of such second insulative layer first surface; positioning such first and second electrode layers in respective alternating layers; providing first conductive termination layer material covering portions of such first electrode layers and electrically connecting such first conductive layer of each of such plurality of first electrode layers; providing second conductive termination layer material covering portions of such second insulative layer and electrically connecting such second conductive layer of each of such plurality of second electrode layers; forming a plurality of conductive traces on a same side of such circuit board, and configured so as to respectively engage such first conductive termination layer material and such second conductive termination layer material; forming a first conductive plane in such circuit board; forming a second conductive plane in such circuit board; forming a plurality of conductive vias through such circuit board and configured to couple respectively such respective first and second conductive termination layer materials with such conductive planes formed in such circuit board; providing such first conductive layer material as one of a power or signal path; providing such second conductive layer material as a ground plane; and selectively configuring such at least one extended length tab connections of such respective first and second conductive layers so as to selectively establish the effective length of respective paths to such respective conductive layers, so that a current path is formed from such first conductive termination layer through such plurality of first electrode layers and plurality of second electrode layers to such second conductive termination layer which cooperates with such circuit board for forming respective current pathways having controlled equivalent series resistance for such component.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIGS. 1*a* and 1*b* represent progressions in the development of low Equivalent Series Inductance (ESL) devices based on current "loop" path length reduction technologies illustrating comparisons to the present technology;

FIGS. 2a, 2b, and 2c illustrate known land grid array (LGA) capacitor electrode designs;

FIGS. 3a, 3b, and 3c illustrate a first embodiment of the present technology providing controlled Equivalent Series Resistance (ESR) by adding path length to active electrodes;

FIGS. 4a, 4b, and 4c illustrate a second embodiment of the present technology providing controlled Equivalent Series Resistance (ESR) by adding path length to active electrodes;

Figure 6A:
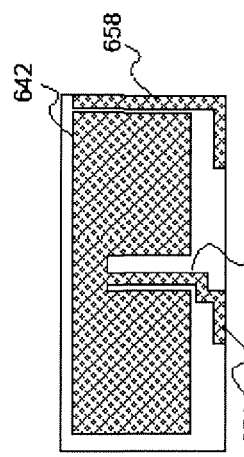
FIGS. 6a, 6b, and 6c depict construction aspects of an exemplary embodiment of a Land Grid Feedthrough capacitors constructed in accordance with the present technology employing added path length to the active electrodes.

Repeat use of reference characters throughout the present specification and appended drawings is intended to represent same or analogous features or elements of the present subject matter.

DETAILED DESCRIPTION OF THE PREFERRED EMBODIMENTS

As discussed in the Summary of the Invention section, the present subject matter is particularly concerned with improved apparatus and methodology for controlled equivalent series resistance (ESR) in a multi-layer ceramic capacitor.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject controlled ESR capacitors. Referring now to the drawings, FIGS. 1a and 1b represent progressions in the development of low Equivalent Series Inductance (ESL) devices based on current path length reduction technologies illustrating comparisons to the present technology. As may be seen in FIG. 1a, there is illustrated a Land Grid Array (LGA) capacitor 100 employing multiple, stacked, horizontally positioned electrodes representatively illustrated at 102, 104.

Capacitor 100 is provided with terminations 112, 114 covering portions of the top, respective sides and bottom of capacitor 100. Terminations 112, 114 may be used to mount capacitor 100 to a printed circuit board 120 by way of appropriate techniques, including, for example, soldering, to conductive traces 122, 124. As illustrated by arrow headed line, in operation, a relatively large current loop 130 is created through capacitor 100, via terminations 112, 114, conductive traces 122, 124, and internal conductive vias and layers 126, 128, of printed circuit board 120. Such large current path 130 leads to increases in Equivalent Series Inductance (ESL).

With reference now to FIG. 1b, there is illustrated a Land Grid Array (LGA) capacitor 140 employing multiple, stacked, vertically positioned generally T-shaped electrodes representatively illustrated at 142, 144. Terminations 152, 154 maybe used to mount capacitor 140 to a printed circuit board 160 by way of appropriate techniques to conductive traces 162, 164. As illustrated by arrow headed line, in operation, a relatively smaller current loop 170 is created through capacitor 140, via terminations 152, 154, conductive traces 162, 164, and internal conductive vias and layers 166, 168, of printed circuit board 160.

It should be appreciated that the active terminals for both capacitor 100 and capacitor 140 corresponding to those portions of their respective terminations that are on the bottom of the device and in contact with the printed circuit board conductive traces contributes to the respectively formed current loops. With respect to capacitor 140, a relatively smaller current loop 170 leads to a decrease in Equivalent Series Inductance (ESL). Aspects related to current cancellation loops have a significant impact on ESL. As the total loop size diminishes so does the ESL of the device. Further, however, such decreases also lead to decreases in Equivalent Series Resistance (ESR) that may present competing issues as will be discussed further later.

With reference now to FIGS. 2a, 2b, and 2c there is illustrated an electrode configuration for a known Land Grid Array (LGA) capacitor as previously illustrated in assembled form in FIG. 1b. As will be appreciated by those of ordinary skill in the art, generally T-shaped electrodes 142, 144 are vertically stacked and separated from each other by way of insulative material, generally represented at 180. When assembled in multiple alternating layer, a capacitor 140 (FIG. 1b) is produced with a gap 200 (FIG. 2c) formed between opposite polarities of electrodes 142, 144 on the "bottom" of the capacitor, i.e., the portion of the capacitor mounted to a circuit board. In LGA capacitor designs, it has been appreciated that ESL is predominately controlled by the spacing of gap 200. It has also been recognized that it is desirable to maintain a very small gap and to preserve current cancellation structure for best high frequency performance.

With reference to FIGS. 3a, 3b, and 3c there is illustrated a first embodiment of the present technology wherein controlled Equivalent Series Resistance (ESR) is provided by adding path length to the active electrodes. With reference to FIGS. 3a and 3b it will be appreciated that there has been illustrated a pair of electrodes 342, 344 that are substantial mirror images of each other. Each electrode 342, 344 has substantially the same overall area as in the prior configurations illustrated in FIGS. 2a and 2b corresponding to electrodes 142, 144, respectively, but each include features that provide increased Equivalent Series Resistance (ESR).

More specifically, as will be noticed in FIG. 3a, side contact portion 352, bottom contact portion 354 and a portion of the central area 356 of electrode 342 have been separated from the main electrode area so that an extended conductive path is created thereby providing increased path length and thus increased ESR for a capacitor constructed in accordance with this first exemplary embodiment of the present technology. It will be understood to those familiar with the art, that the longer, the narrower, and/or the thinner the path, the greater the ESR will be. A similar such extended conductive path is provided by portions 362,364, 366 of electrode 344 as illustrated in FIG. 3b. Portions 352 and 354 of electrode 342 and corresponding portion 362, 364 of electrode 344 that do not immediately connect to the active portion of their respective electrode are present for Fine Copper Termination (FCT) purposes relating to the electrical connection of the various alternate electrode layers, and do not materially contribute to the ESR. A methodology for forming FCT connections is described in commonly owned U.S. Pat. No. 7,152,291 to Ritter, et al. entitled "Method for forming plated terminations" which is incorporated herein in its entirety and for all purposes.

Referring now to FIG. 3c, it will be seen that a capacitor may be formed by alternately stacking plural electrode layers corresponding to electrodes 342, 344 among separating insulative layers (not separately identified). With further reference to FIG. 3c, it should be noticed that, when stacked in layers, portions 356 and 366 of electrodes 342 and 344 respectively, overlap each other. Such overlapping provides an increase in current cancellation within the capacitor without significantly increasing Equivalent Series Inductance (ESL), which, like the capacitor illustrated in FIG. 3c is still controlled primarily by the spacing of gap 320.

With reference to FIGS. 4a, 4b, and 4c there is illustrated a second embodiment of the present technology wherein controlled Equivalent Series Resistance (ESR) is provided by adding path length to the active electrodes. With reference to FIGS. 4a and 4b it will be appreciated that there has been illustrated a pair of electrodes 442, 444 that are substantial mirror images of each other. Each electrode 442, 444 has substantially the same overall area as in the prior configurations illustrated in FIGS. 3a and 3b corresponding to electrodes 342, 344, respectively, and each include features that provide increased Equivalent Series Resistance (ESR).

More specifically, as will be noticed in FIG. 4a, side contact portion 452, bottom contact portion 454 and a portion of the central area 456 of electrode 442 have been separated from the main electrode area so that an extended conductive path is created thereby providing increased ESR for a capacitor constructed in accordance with this second exemplary embodiment of the present technology. A similar such extended conductive path is provided by portions 462,464, 466 of electrode 444 as illustrated in FIG. 4b. Portions 452 and 454 of electrode 442 and corresponding portion 462, 464 of electrode 444 that do not immediately connect to the active portion of their respective electrode are present for Fine Copper Termination (FCT) purposes as discussed with respect to FIGS. 3a and 3b.

Referring now to FIG. 4c, it will be seen that a capacitor may be formed by alternately stacking plural electrode layers corresponding to electrodes 442, 444 among separating insulative layers (not separately identified). With further reference to FIG. 4c, it should be noticed that, when stacked in layers, portions 456 and 466 of electrodes 442 and 444 respectively, are aligned in parallel with each other but do not overlay as in the first embodiment illustrated in FIG. 3c. By providing a slight offset in portions 456, 466 over corresponding portions 366, 356 of the first embodiment, a small portion of the current cancellation capability is sacrificed for improved high frequency performance.

Figure 5A:
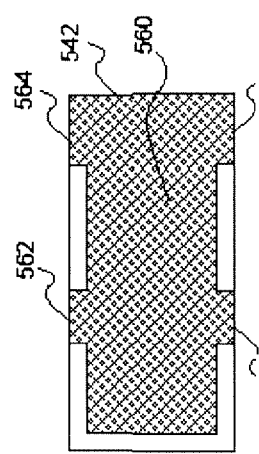
FIGS. 5a, 5b, and 5c depict in part construction aspects of a known four-terminal Land Grid Feedthrough (LGF) capacitor.
Figure 5B:
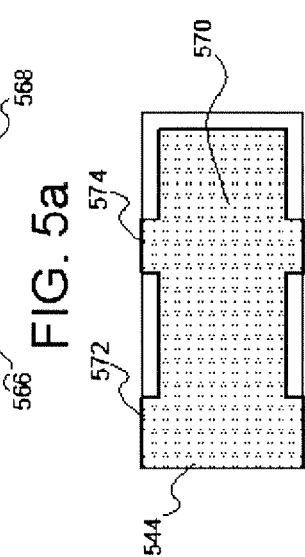
Figure 5C:
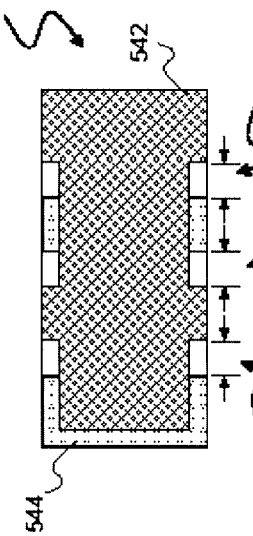

With respect now to FIGS. 5a, 5b, and 5c there is depicted construction aspects of a known four-terminal Land Grid Feedthrough (LGF) capacitor 500. As with the previously illustrated capacitors, capacitor 500 corresponds to a mirrored pair of electrodes 542, 544 that may be alternately stacked among insulative layers to produce capacitor 500. Electrode 542 includes a main active portion 560 and four tabs 562, 564, 566, 568 with two each along a top portion and two along a bottom portion of electrode 542.

Similarly, electrode 544 includes a main active portion 570 and four tabs 572, 574, 576, 578 with two each along a top portion and two along a bottom portion of electrode 544. As illustrated in FIG. 5c, when electrodes 542, 544 are alternately stack to form capacitor 500, three gaps 520, 522, 524 are formed that generally correspond to the previously identified gaps and are also instrumental in controlling ESL for capacitor 500.

Figure 6B:
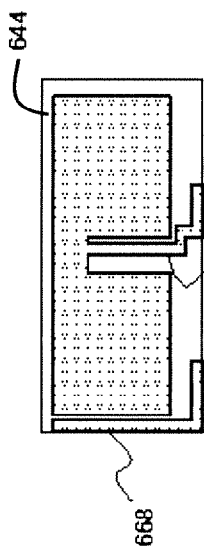
Figure 6C:
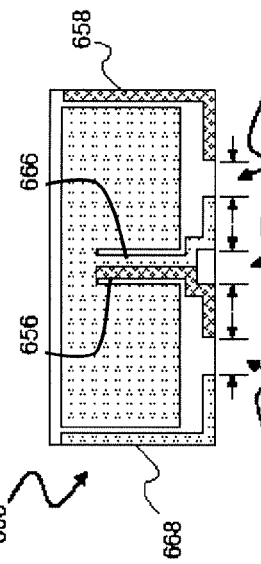

With reference now to FIGS. 6a, 6b, and 6c there are depicted construction aspects of an exemplary embodiment of a Land Grid Feedthrough capacitor 600 similar to the known configuration illustrated in FIGS. 5a-5c but constructed in accordance with the present technology employing added path length to the active electrodes.

Controlled ESR capacitor 600 as illustrated in FIGS. 6a-6c differs slightly from the previous implementations of the present technology as applied to the capacitors illustrated in FIGS. 3a-4c. First it may be noticed that capacitor 600 eliminates the top pair of tabs corresponding to tabs 562, 564, 572, 574 of the capacitor illustrated in FIGS. 5a-5c. Moreover, while an embodiment may be created following the approach disclosed with respect to the exemplary embodiments of the present technology illustrated in FIGS. 3a-4c (and such possible alternate embodiment is not disclaimed), the exemplary embodiment of FIGS. 6a-6c provides only a single added path length for each electrode although the electrode material itself is retained for FCT purposes.

With further specific reference to FIG. 6a, it will be appreciated that electrode 642 has been provided with an extended path length tab corresponding to tab portions 654, 656. In addition, tab portion 658, although electrically isolated from the main active area of electrode 642 is retained to provide FCT "dummy" or "anchor" tab aspects for capacitor 600. It should be kept in mind that one aspect of the present subject matter is to maintain small current loops formed by the basic LGA architecture, to keep ESL low, and at the same time adding path length to a resistor tab to increase ESR. If one were to provide tab portion 658 as an electrical connection to electrode 642, such tab portion would end up connected in parallel with tab portion 654, 656 and thereby would lower the equivalent resistance of the tabs. Such possibility may be provided in certain embodiments of the present subject matter, but is excluded in this particular embodiment based in part on a desire to allow construction of a dual capacitor component configuration as will be described more fully later.

With reference to FIG. 6b, it will be appreciated that electrode 644 is a substantial mirror image of electrode 642. Thus, electrode 644 includes extended tab portions 644, 666 configured to provide additional ESR for the capacitor and electrically isolated tab portion 668 provided to allow use of FCT technology in the construction of capacitor 600.

With reference now to FIG. 6c, it will be noticed that capacitor 600 is assembled by alternately stack electrodes 642, 644 among separation layers of insulative material (not specifically identified) so that a plurality of layers are provided and may later be connected together using FCT or other known methodologies to produce the finished capacitor. It will be further noticed that gaps 620, 622, 624 are created as a result of the stacking of the various layers of electrodes although only gap 622 has an impact on the ESL of the device. Gaps 620 and 624 which, in the present configuration establish external connection spacing criteria, may become important in the case of the creation of an alternate embodiment were presently illustrated electrically isolated tabs 658, 668 may also be electrically connected to their respective electrodes where it might be advantages based on certain circumstances to reduce the value of the ESR by providing parallel tab connections.

Finally with respect to FIG. 6c, it may be observed that extended tab portion 656 and 666 are aligned in a non-overlapping parallel configuration in a manner similar to that illustrated with respect to the second embodiment described with respect to FIG. 4c. It should be appreciated by those of ordinary skill in the art that a modification to the third embodiment might provide for an overlapping configuration of extended tabs 656, 666 more nearly like that illustrated in FIG. 3c to provide for an increase in current cancellation at the expense of high frequency performance if that alternative is desirable in certain other circumstances.

Figure 7A:
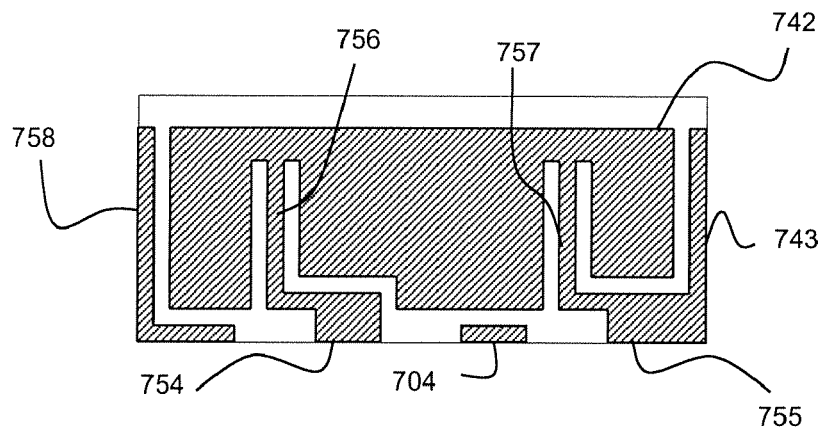
FIG. 7a, 7b, and 7c depict construction aspects of a reduced inductance form present exemplary embodiment that incorporates added path length for dual access to each electrode.
Figure 7B:
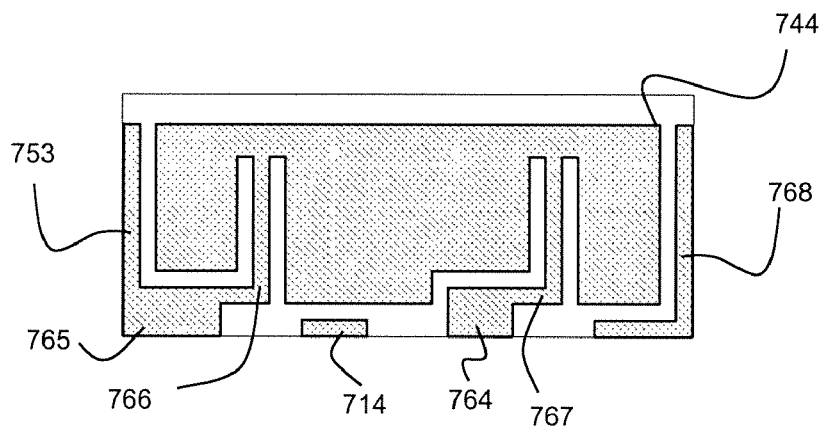
Figure 7C:
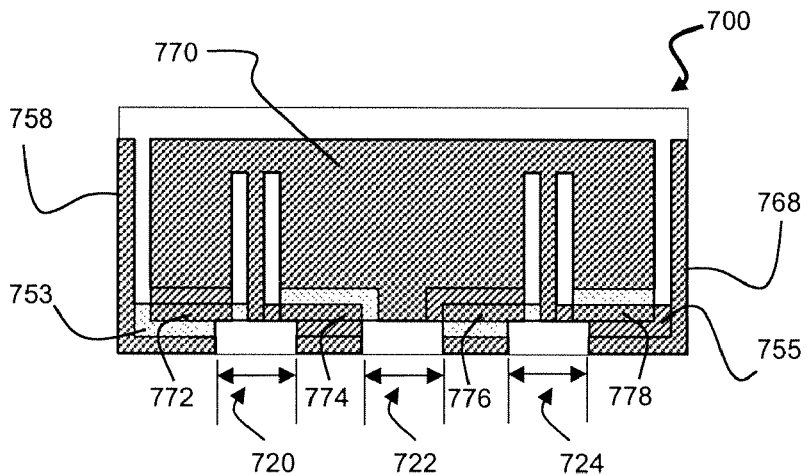

Referring now to FIGS. 7a through 7c, there is depicted an exemplary capacitor similar to that referenced in respective FIGS. 6a through 6c, except for incorporation of two extended tabs. FIGS. 7a and 7b, respectively, also differ slightly from FIGS. 6a and 6b in that additional electrically isolated portions 704 and 714 are provided that principally provide FCT support as "dummy" tabs.

In FIG. 7a, the main electrode 742 is connected through extensions 756 and 757 to the tabs 754 and 755, respectively. The external tab 755 has an extension portion along the exposed side 743, both of which will form the external terminations on the side and bottom edge. FIG. 7a further shows the isolated anchor or dummy tab at 758 which wraps around the edge to assist with electrode tab 753 (FIG. 7b) in the final termination structure. Similarly, the isolated dummy tab 704 will provide with extended tab 767 (FIG. 7b) the dummy tab for the bottom land structure.

FIG. 7b is the mirror image of FIG. 7a and will have the same purposes as such figure though for the opposite polarity. Main electrode 744 has extended tabs 766 and 767 which connect to the external tab structure at 764 and 765, respectively. Elements 714 and 768 are isolated dummy tabs which along with the corresponding features in FIG. 7a will assist in the formation of external terminations.

FIG. 7c depicts the subsequent overlap of the structures (designs) of FIGS. 7a and 7b. With a dielectric in between, such structures form a unit cell (generally 700), that yield an exemplary embodiment of the present features. In the context of such embodiment, there are two significant structures that are formed as a result of the illustrated overlap. First, the extended tabs 756 and 757 (shown in FIG. 7a) in such combined condition completely overlap the extensions 766 and 767 of FIG. 7b. Such aspect in this exemplary embodiment contributes to lowering inductance. A second exemplary resulting advantage is that there is formed at indicated features 772, 774, 776, and 778 a secondary capacitive overlap, which will promote a favorable second resonance, as further described herein. The primary overlap, and thus the primary capacitance, is shown at element 770. The presently referenced inductance reduction is further promoted by reducing as much as possible the tab separations shown at 720, 722, and 724. The dummy tab and extension 758 alternates with the one polarity electrode tab 753 to form the side and bottom first contact. Similarly, the dummy tab 768 functions with electrode tab 755 to form the side and bottom first contact for the second polarity. The second contacts for each polarity are formed by the overlap of features 754 and 704 of FIG. 7a with features 714 and 764 of FIG. 7b.

Figure 8A:
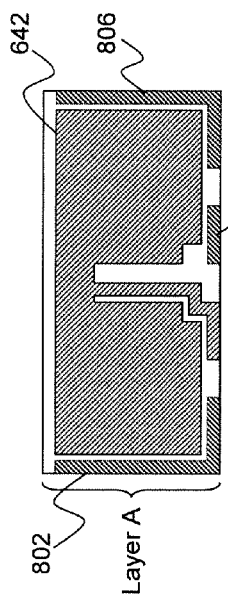
FIGS. 8a, 8b, and 8c depict construction aspects of an exemplary embodiment of a first portion of an exemplary dual capacitor high ESR multiple electrode capacitor constructed in accordance with the present technology.
Figure 8B:
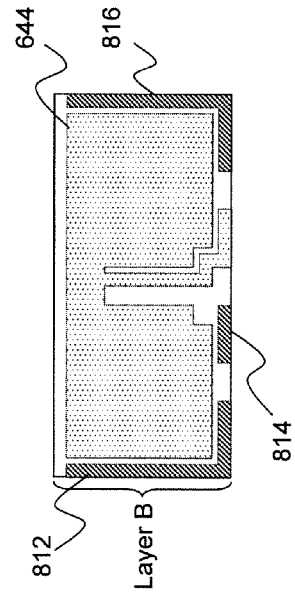
Figure 8C:
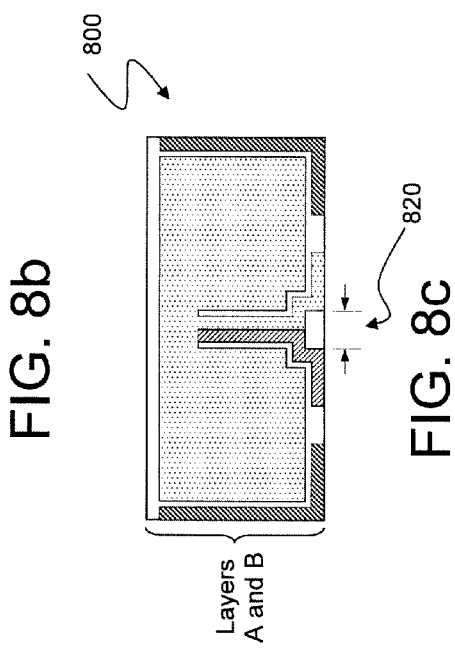

With reference now to FIGS. 8a, 8b, and 8c, there is depicted construction aspects of an exemplary embodiment of a first portion of an exemplary dual capacitor high ESR multiple electrode capacitor constructed in accordance with the present technology. More particularly, it may be appreciated that FIGS. 8a, 8b, and 8c correspond almost identically to FIGS. 6a, 6b, and 6c, respectively. FIG. 8a differs slightly from FIG. 6a in that additional electrically isolated portions 802, 804, 806 are provided that principally provide FCT support as "dummy" tabs.

Similarly, FIG. 8b differs from FIG. 6b by way of the addition of electrically isolated portions 814 and 816 that also support FCT aspects of the assembled device. For convenience in further explanation of the dual resonance aspects of the present embodiment of the present subject matter, the electrode layer illustrated in FIG. 8a may be denoted as "Layer A." In like manner, the electrode layer illustrated in FIG. 8b may be denoted as "Layer B." FIG. 8c illustrates the overlapping arrangement achieved upon alternate stacking of the Layer A and Layer B electrodes.

It may be noticed that the centrally positioned extended tabs are offset from each other as described previously with respect to FIG. 6c. It should, however, be appreciated that a fully overlapping configuration such as illustrated in FIG. 3c may also be employed in certain other embodiments that would also fully correspond to the disclosure of the present technology.

Figure 9A:
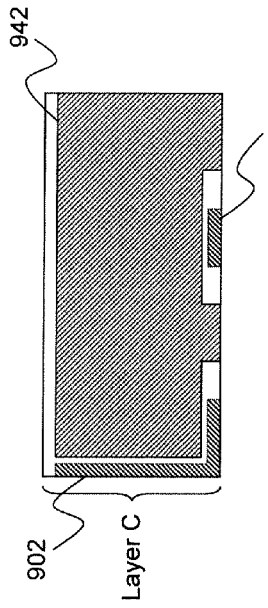
FIGS. 9a, 9b, and 9c depict construction aspects of an exemplary embodiment of a second portion of an exemplary dual capacitor high ESR multiple electrode capacitor constructed in accordance with the present technology.
Figure 9B:
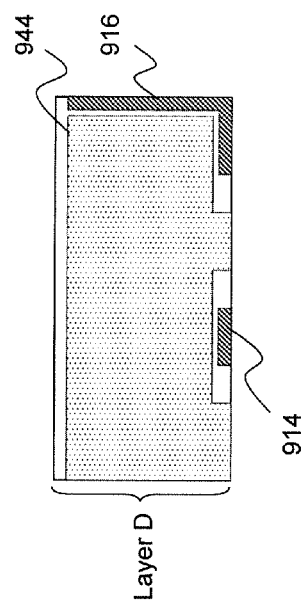
Figure 9C:
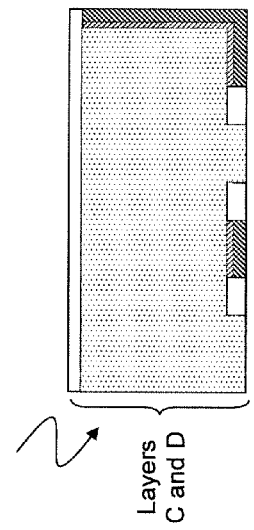

With reference now to FIGS. 9a, 9b, and 9c, there are depicted construction aspects of an exemplary embodiment of a second portion of an exemplary dual capacitor high ESR multiple electrode capacitor constructed in accordance with the present technology. As may be appreciated from a comparison of the construction details illustrated in FIGS. 9a, 9b, and 9c in comparison with those of FIG. 5a, 5b, and 5c, respectively, the electrode configurations are somewhat similar. Difference are evident in that the electrodes of FIGS. 9a, 9b and 9c lack the top tabs 562, 564, 572, 574 as illustrated in FIGS. 5a, 5b, and 5c and also include electrically isolated portions 902, 904, 914, 916, similar to portions 802, 804, 806, 812, 814, and 816 of FIGS. 8a and 8b. Electrically isolated portions 902, 904, 914, 916 provide FCT related "dummy tab" aspects to the finished device in a manner similar to previously described electrically isolated tab portions.

In accordance with the present technology, capacitor 800 (FIG. 8c) may be described as a low Q, large value capacitor section. Capacitor 900 (FIG. 9c) may, on the other hand, be described as a low ESL, low value capacitor section, said relative values deriving from the number of pattern repetitions, or "active layers." Further, in accordance with the present technology, a dual value device may be created by stacking enough Layer C and Layer D combinations to produce a target value "C2" capacitor and enough Layer A and Layer B combinations may be stacked together to produce a target value "C1" capacitor. In exemplary configurations, such objective may be achieved by stacking sequences represented as C-D-C-D-A-B-A-B-A-B or A-B-A-B-A-B-D-C-D-C to achieve selected capacitive values. Those of ordinary skill in the art will appreciate that many such layers may be required to achieve the target values. Further, those of ordinary skill in the art will readily appreciate that the number of layer combinations as between A-B combinations and C-D combinations will likely be quite different from each other depending on the target values of capacitance desired.

With respect to the relatively increased ESR provided by the extended tab, those skilled in the art will understand that the resistance of that segment can be increased or decreased by altering the length, width, or thickness of the tab. Furthermore, the tab material can be changed by overprinting with an additional amount of material, or a dopant to decrease or increase, respectively, the relative resistance.

Figure 10:
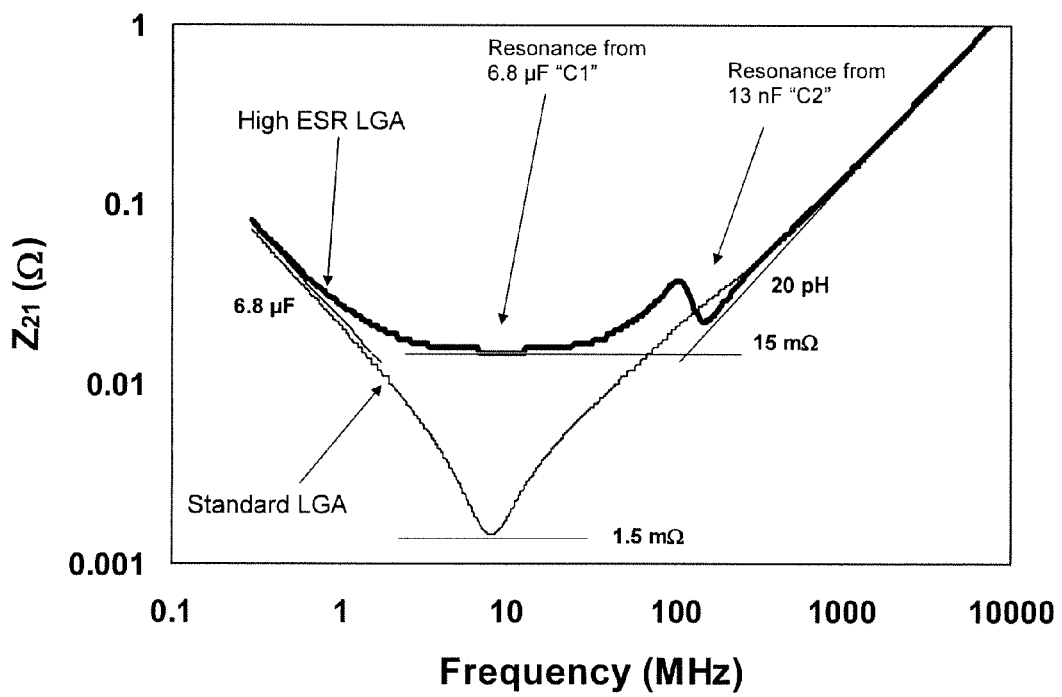
FIG. 10 graphically illustrates a comparison between standard and high ESR capacitors and illustrates a dual resonance behavior from a dual capacitor design.

With reference now to FIG. 10, there is graphically illustrated a comparison between standard and high ESR capacitors and, at the same time, an illustration of a dual resonance behavior from a dual capacitor design in accordance with the present technology. As may be noted for FIG. 10, a dual capacitor may be created in accordance with the present technology by housing together a first capacitor "C1" and a second capacitor "C2" coupled in parallel where at least one of the capacitors employs extended resistor tabs in accordance with the present technology. By providing parallel coupled capacitors in this manner, a dual resonance behavior may be achieved.

With further reference to FIG. 10, in an exemplary configuration a first capacitor C1 having an exemplary value of 6.8 µF may be connected in parallel with a second capacitor C2 having an exemplary value of 13 nF. By constructing the first capacitor C1 to include extended resistor tabs in accordance with the present technology, a dual resonance high ESR LGA device may be created. With specific reference to FIG. 10, it may be observed that a standard LGA capacitor device, for example as depicted in FIG. 5c, may exhibit a resonance point at about 10 MHz. In accordance with the present technology a dual resonance is provided with a first resonance point also at about 10 MHZ but with a second resonance point due to the presence of capacitor C2 at about 200 MHz. Such result may be achieved through combination of elements as explained hereinabove with reference to FIGS. 7a-9c.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A multilayer electronic component, comprising:
   a plurality of first electrode layers, each first electrode layer comprising a first insulative layer having first and second surfaces thereof bounded by four edges and a first conductive layer covering a portion of said first surface of said first insulative layer and having a main electrode area and at least one extended length tab connection extending from said first conductive layer main electrode area to at least one edge of said first insulative layer first surface;
   a plurality of second electrode layers alternately stacked with said plurality of first electrode layers and comprising mirror images thereof, each second electrode layer comprising a second insulative layer having first and second surfaces thereof bounded by four edges and a second conductive layer covering a portion of said first surface of said second insulative layer and having a main electrode area and at least one extended length tab connection extending from said second conductive layer main electrode area to at least one edge of said second insulative layer first surface;
   first conductive termination layer material covering portions of said first electrode layers and electrically connecting said first conductive layer of each of said plurality of first electrode layers; and
   second conductive termination layer material covering portions of said second insulative layer and electrically connecting said second conductive layer of each of said plurality of second electrode layers;
   wherein said at least one extended length tab connections of said respective first and second conductive layers are selectively configured so as to selectively establish the effective length of respective paths to such respective conductive layers, whereby a current path is formed from said first conductive termination layer through said plurality of first electrode layers and plurality of second electrode layers to said second conductive termination layer which cooperates with an associated circuit board for forming respective current pathways having controlled equivalent series resistance for said component;
   said multilayer electronic component further comprises at least one edge tab portion formed on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat; and
   each of said at least one edge tab portion is respectively electrically connected in parallel with said at least one extended length tab connection of said insulative layer first surface with which it is associated, so as to relatively lower the equivalent resistance of such extended length tab connection.

2. A multilayer electronic component as in claim 1, wherein at least one of the length, width, and thickness of said at least one extended length tab connections of said respective first and second conductive layers is selectively configured so as to selectively establish the equivalent series resistance for said component.

3. A multilayer electronic component as in claim 1, wherein said at least one extended length tab connections of said respective first and second conductive layers are selectively configured so as to respectively extend to at least two edges of said insulative layer first surface with which it is associated.

4. A multilayer electronic component as in claim 1, wherein said first conductive termination layer material and said second conductive termination layer material are configured so as to form a gap therebetween along a portion of said at least one edge of both said first and second electrode layers, whereby said current path includes a current loop area formed from said first conductive termination layer through said plurality of first electrode layers and plurality of second electrode layers to said second conductive termination layer which cooperates with an associated circuit board for forming respective current cancellation pathways, for lowering equivalent series inductance of said component.

5. A multilayer electronic component as in claim 4, wherein terminal layer material spacing is minimized at said gap so as to provide reduction in equivalent series inductance of said component as said gap is reduced.

6. A multilayer electronic component as in claim 4, wherein terminal layer material spacing at said gap is configured for minimizing such gap but without overlap of respective extended length tab connections, so as to provide relative reduction in equivalent series inductance of said component while improving high frequency performance of said component.

7. A multilayer electronic component as in claim 4, wherein said multilayer electronic component comprises a vertically oriented, multilayer ceramic decoupling capacitor.

8. A circuit board combination, comprising:
a multilayer electronic component as in claim 7;
a circuit board;
a plurality of conductive traces formed on a same side of said circuit board, and configured so as to respectively engage said first conductive termination layer material and said second conductive termination layer material;
a first conductive plane formed in said circuit board;
a second conductive plane formed in said circuit board; and
a plurality of conductive vias formed through said circuit board and configured to couple respectively said respective first and second conductive termination layer materials with said conductive planes formed in said circuit board.

9. A circuit board combination as in claim 8, wherein:
said first conductive layer material comprises one of a power or signal path; and
said second conductive layer material comprises a ground plane.

10. A multilayer electronic component as in claim 1, wherein each of said at least one edge tab portions is selectively configured so as to respectively extend along at least two edges of said insulative layer first surface with which it is associated.

11. A multilayer electronic component as in claim 1, further comprising at least a second extended length tab connection extending respectively from each of said conductive layer main electrode area to at least one edge of its respective insulative layer first surface, so as provide dual access to each respective conductive layer so as to provide relatively reduced equivalent inductance of said component.

12. A multilayer electronic component as in claim 11, further comprising at least one edge tab portion formed on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat.

13. A multilayer electronic component as in claim 1, wherein:
said multilayer electronic component comprises a vertically oriented, multilayer ceramic dual capacitor decoupling multiple electrode capacitor;
each of said first and second electrode layers further comprises at least two respective edge tab portions formed on each of said respective insulative layers and electrically isolated from said main electrode area of said respective first and second conductive layers with which it is associated, and which are selectively configured so as to respectively extend along at least two edges of said insulative layer first surface with which it is associated, each of said tab portions providing an edge nucleation area for formation of termination material thereat; and
said multilayer electronic component comprises a plurality of respective third and fourth electrode layers, with each third electrode layer comprising a third insulative layer having first and second surfaces thereof bounded by four edges and a third conductive layer covering a portion of said first surface of said third insulative layer and having a main electrode area and at least two extended length tab connections extending from said third conductive layer main electrode area to at least two respective edges of said third insulative layer first surface, and with each of said plurality of fourth electrode layers alternately stacked with said plurality of third electrode layers and comprising mirror images thereof, each fourth electrode layer comprising a fourth insulative layer having first and second surfaces thereof bounded by four edges and a fourth conductive layer covering a portion of said first surface of said fourth insulative layer and having a main electrode area and at least two respective extended length tab connections extending from said fourth conductive layer main electrode area to at least two edges of said fourth insulative layer first surface.

14. A multilayer electronic component as in claim 13, further comprising at least one edge tab portion formed on each of said respective third and fourth insulative layers and electrically isolated from said main electrode area of said respective third and fourth conductive layers with which it is associated, and which are selectively configured so as to respectively extend along at least one edge of said insulative layer first surface with which it is associated, each of said tab portions providing an edge nucleation area for formation of termination material thereat.

15. A circuit board and electronic component combination, comprising a multilayer land grid feedthrough vertically-oriented ceramic capacitor mounted on a multilayer printed circuit board, for effective filtering capabilities for signal level lines and decoupling of power level lines or circuit planes, and for providing controlled equivalent series resistance of such electronic component, such combination comprising:
a plurality of first electrode layers, each first electrode layer comprising a first insulative layer having first and second surfaces thereof bounded by four edges and a first conductive layer covering a portion of said first surface of said first insulative layer and having a main electrode area and at least one extended length tab connection extending from said first conductive layer main electrode area to at least one edge of said first insulative layer first surface;
a plurality of second electrode layers alternately stacked with said plurality of first electrode layers and comprising mirror images thereof, each second electrode layer comprising a second insulative layer having first and second surfaces thereof bounded by four edges and a second conductive layer covering a portion of said first surface of said second insulative layer and having a main electrode area and at least one extended length tab connection extending from said second conductive layer main electrode area to at least one edge of said second insulative layer first surface;
first conductive termination layer material covering portions of said first electrode layers and electrically connecting said first conductive layer of each of said plurality of first electrode layers;
second conductive termination layer material covering portions of said second insulative layer and electrically connecting said second conductive layer of each of said plurality of second electrode layers;
a plurality of conductive traces formed on a same side of said circuit board, and configured so as to respectively engage said first conductive termination layer material and said second conductive termination layer material;
a first conductive plane formed in said circuit board;
a second conductive plane formed in said circuit board; and
a plurality of conductive vias formed through said circuit board and configured to couple respectively said respective first and second conductive termination layer materials with said conductive planes formed in said circuit board;

wherein said first conductive layer material comprises one of a power or signal path;

said second conductive layer material comprises a ground plane;

said at least one extended length tab connections of said respective first and second conductive layers are selectively configured so as to selectively establish the effective length of respective paths to such respective conductive layers, whereby a current path is formed from said first conductive termination layer through said plurality of first electrode layers and plurality of second electrode layers to said second conductive termination layer which cooperates with said circuit board for forming respective current pathways having controlled equivalent series resistance for said component;

said circuit board and electronic component combination further comprises at least one edge tab portion formed on each of said respective insulative layers and electrically isolated from said main electrode area of said respective first and second conductive layers with which it is associated, and which are selectively configured so as to respectively extend along at least one edqe of said insulative layer first surface with which it is associated, each of said tab portions providing an edge nucleation area for formation of termination material thereat; and each of said at least one edge tab portion is respectively electrically connected in parallel with said at least one extended length tab connection of said insulative layer first surface with which it is associated, so as to relatively lower the equivalent resistance of such extended length tab connection.

16. A circuit board and electronic component combination as in claim 15, wherein:

said first conductive termination layers and said second conductive termination layers are configured so as to form a gap therebetween along a portion of said at least one edge of both said first and second electrode layers;

whereby a current loop area is formed from said first conductive termination layers through said plurality of first electrode layers and plurality of second electrode layers to said second conductive termination layers which cooperates with said conductive traces, said conductive vias, and said conductive planes, for forming respective current cancellation pathways, for lowering equivalent series inductance of said component, with said terminal layer material spacing minimized at said gap so as to provide reduction in equivalent series inductance of said component as said gap is reduced.

17. A circuit board and electronic component combination as in claim 15, wherein at least one of the length, width, and thickness of said at least one extended length tab connections of said respective first and second conductive layers is selectively configured so as to selectively establish the equivalent series resistance for said component.

18. A circuit board and electronic component combination as in claim 15, wherein said at least one extended length tab connections of said respective first and second conductive layers are selectively configured so as to respectively extend to at least two edges of said insulative layer first surface with which it is associated.

19. A circuit board and electronic component combination as in claim 15, wherein each of said at least one edge tab portions is selectively configured so as to respectively extend along at least two edges of said insulative layer first surface with which it is associated.

20. A circuit board and electronic component combination as in claim 15, further comprising at least a second extended length tab connection extending respectively from each of said conductive layer main electrode area to at least one edge of its respective insulative layer first surface, so as provide dual access to each respective conductive layer so as to provide relatively reduced equivalent inductance of said component.

21. A circuit board and electronic component combination as in claim 15, wherein:

said multilayer electronic component comprises a vertically oriented, multilayer ceramic dual capacitor decoupling multiple electrode capacitor;

each of said first and second electrode layers further comprises at least two respective edge tab portions formed on each of said respective insulative layers and electrically isolated from said main electrode area of said respective first and second conductive layers with which it is associated, and which are selectively configured so as to respectively extend along at least two edges of said insulative layer first surface with which it is associated, each of said tab portions providing an edge nucleation area for formation of termination material thereat; and said multilayer electronic component comprises a plurality of respective third and fourth electrode layers, with each third electrode layer comprising a third insulative layer having first and second surfaces thereof bounded by four edges and a third conductive layer covering a portion of said first surface of said third insulative layer and having a main electrode area and at least two extended length tab connections extending from said third conductive layer main electrode area to at least two respective edges of said third insulative layer first surface, and with each of said plurality of fourth electrode layers alternately stacked with said plurality of third electrode layers and comprising mirror images thereof, each fourth electrode layer comprising a fourth insulative layer having first and second surfaces thereof bounded by four edges and a fourth conductive layer covering a portion of said first surface of said fourth insulative layer and having a main electrode area and at least two respective extended length tab connections extending from said fourth conductive layer main electrode area to at least two edges of said fourth insulative layer first surface.

22. A circuit board and electronic component combination as in claim 21, further comprising at least one edge tab portion formed on each of said respective third and fourth insulative layers and electrically isolated from said main electrode area of said respective third and fourth conductive layers with which it is associated, and which are selectively configured so as to respectively extend along at least one edge of said insulative layer first surface with which it is associated, each of said tab portions providing an edge nucleation area for formation of termination material thereat.

23. A multilayer land grid feedthrough vertically-oriented ceramic capacitor for mounting on a multilayer printed circuit board, for effective filtering capabilities for signal level lines and decoupling of power level lines or circuit planes, for providing controlled equivalent series resistance, and for providing low equivalent series inductance by employing current canceling techniques, such combination further including:

a plurality of first electrode layers, each first electrode layer comprising a first insulative layer having first and second surfaces thereof bounded by four edges and a first conductive layer covering a portion of said first surface of said first insulative layer and having a main electrode area and at least one extended length tab connection extending from said first conductive layer main electrode area to at least one edge of said first insulative layer first surface;

a plurality of second electrode layers alternately stacked with said plurality of first electrode layers and comprising mirror images thereof, each second electrode layer comprising a second insulative layer having first and second surfaces thereof bounded by four edges and a second conductive layer covering a portion of said first surface of said second insulative layer and having a main electrode area and at least one extended length tab connection extending from said second conductive layer main electrode area to at least one edge of said second insulative layer first surface;

first conductive termination layer material covering portions of said first electrode layers and electrically connecting said first conductive layer of each of said plurality of first electrode layers; and second conductive termination layer material covering portions of said second insulative layer and electrically connecting said second conductive layer of each of said plurality of second electrode layers;

wherein said at least one extended length tab connections of said respective first and second conductive layers are selectively configured so as to selectively establish the effective length of respective paths to such respective conductive layers, whereby a current path is formed from said first conductive termination layer through said plurality of first electrode layers and plurality of second electrode layers to said second conductive termination layer which cooperates with an associated circuit board for forming respective current pathways having controlled equivalent series resistance for said component;

said first conductive termination layer material and said second conductive termination layer material are configured so as to form a gap therebetween along a portion of said at least one edge of both said first and second electrode layers, whereby said current path includes a current loop area formed from said first conductive termination layer through said plurality of first electrode layers and plurality of second electrode layers to said second conductive termination layer which cooperates with an associated circuit board for forming respective current cancellation pathways, for lowering equivalent series inductance of said component;

terminal layer material spacing is minimized at said gap so as to provide reduction in equivalent series inductance of said component as said gap is reduced;

said capacitor further comprises at least one edge tab portion formed on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat; and each of said at least one edge tab portion is respectively electrically connected in parallel with said at least one extended length tab connection of said insulative layer first surface with which it is associated, so as to relatively lower the equivalent resistance of such extended length tab connection.

24. A multilayer land grid feedthrough vertically-oriented ceramic capacitor for mounting on a multilayer printed circuit board as in claim 23, wherein at least one of the length, width, and thickness of said at least one extended length tab connections of said respective first and second conductive layers is selectively configured so as to selectively establish the equivalent series resistance for said component.

25. A multilayer land grid feedthrough vertically-oriented ceramic capacitor for mounting on a multilayer printed circuit board as in claim 23, wherein said at least one extended length tab connections of said respective first and second conductive layers are selectively configured so as to respectively extend to at least two edges of said insulative layer first surface with which it is associated.

26. A circuit board combination, comprising:
a circuit board;
a multilayer electronic component as in claim 24;
a plurality of conductive traces formed on a same side of said circuit board, and configured so as to respectively engage said first conductive termination layer material and said second conductive termination layer material;
a first conductive plane formed in said circuit board;
a second conductive plane formed in said circuit board; and
a plurality of conductive vias formed through said circuit board and configured to couple respectively said respective first and second conductive termination layer materials with said conductive planes formed in said circuit board;
wherein said first conductive layer material comprises one of a power or signal path; and said second conductive layer material comprises a ground plane.

27. A multilayer land grid feedthrough vertically-oriented ceramic capacitor for mounting on a multilayer printed circuit board as in claim 23, further comprising at least a second extended length tab connection extending respectively from each of said conductive layer main electrode area to at least one edge of its respective insulative layer first surface, so as to provide dual access to each respective conductive layer so as to provide relatively reduced equivalent inductance of said component.

28. A multilayer land grid feedthrough vertically-oriented ceramic capacitor for mounting on a multilayer printed circuit board as in claim 23, wherein:
said ceramic capacitor comprises a vertically oriented, multilayer ceramic dual capacitor decoupling multiple electrode capacitor;
each of said first and second electrode layers further comprises at least two respective edge tab portions formed on each of said respective insulative layers and electrically isolated from said main electrode area of said respective first and second conductive layers with which it is associated, and which are selectively configured so as to respectively extend along at least two edges of said insulative layer first surface with which it is associated, each of said tab portions providing an edge nucleation area for formation of termination material thereat; and
said multilayer electronic component comprises a plurality of respective third and fourth electrode layers, with each third electrode layer comprising a third insulative layer having first and second surfaces thereof bounded by four edges and a third conductive layer covering a portion of said first surface of said third insulative layer and having a main electrode area and at least two extended length tab connections extending from said third conductive layer main electrode area to at least two respective edges of said third insulative layer first surface, and with each of said plurality of fourth electrode layers alternately stacked with said plurality of third electrode layers and comprising mirror images thereof, each fourth electrode layer comprising a fourth insulative layer having first and second surfaces thereof bounded by four edges and a fourth conductive layer covering a portion of said first surface of said fourth insulative layer and having a main electrode area and at least two respective extended length tab connections extending from said fourth conductive layer main electrode area to at least two edges of said fourth insulative layer first surface;

said capacitor further comprising at least one edge tab portion formed on each of said respective third and fourth insulative layers and electrically isolated from said main electrode area of said respective third and fourth conductive layers with which it is associated, and which are selectively configured so as to respectively extend along at least one edge of said insulative layer first surface with which it is associated, each of said tab portions providing an edge nucleation area for formation of termination material thereat.

29. A method of making a multilayer electronic component, comprising:

providing a plurality of first electrode layers, each first electrode layer comprising a first insulative layer having first and second surfaces thereof bounded by four edges and a first conductive layer covering a portion of said first surface of said first insulative layer and having a main electrode area and at least one extended length tab connection extending from said first conductive layer main electrode area to at least one edge of said first insulative layer first surface;

providing a plurality of second electrode layers comprising mirror images of said plurality of first electrode layers, each second electrode layer comprising a second insulative layer having first and second surfaces thereof bounded by four edges and a second conductive layer covering a portion of said first surface of said second insulative layer and having a main electrode area and at least one extended length tab connection extending from said second conductive layer main electrode area to at least one edge of said second insulative layer first surface;

positioning said first and second electrode layers in respective alternating layers;

providing first conductive termination layer material covering portions of said first electrode layers and electrically connecting said first conductive layer of each of said plurality of first electrode layers;

providing second conductive termination layer material covering portions of said second insulative layer and electrically connecting said second conductive layer of each of said plurality of second electrode layers;

selectively configuring said at least one extended length tab connections of said respective first and second conductive layers so as to selectively establish the effective length of respective paths to such respective conductive layers, so that a current path is formed from said first conductive termination layer through said plurality of first electrode layers and plurality of second electrode layers to said second conductive termination layer which cooperates with an associated circuit board for forming respective current pathways having controlled equivalent series resistance for said component; and forming at least one edge tab portion on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat;

wherein said forming at least one edge tab portion includes selectively configuring each of such edge tab portions so as to be respectively electrically connected in parallel with said at least one extended length tab connection of said insulative layer first surface with which it is associated, so as to relatively lower the equivalent resistance of such extended length tab connection.

30. A method of making a multilayer electronic component as in claim 29, wherein said selectively configuring of said at least one extended length tab connections of said respective first and second conductive layers further includes selectively configuring at least one of the length, width, and/or thickness thereof, so as to selectively establish the equivalent series resistance for said component.

31. A method of making a multilayer electronic component as in claim 29, wherein said selectively configuring of said at least one extended length tab connections of said respective first and second conductive layers further includes selectively configuring such tab connections so as to respectively extend to at least two edges of said insulative layer first surface with which it is associated.

32. A method of making a multilayer electronic component as in claim 29, further including configuring said first conductive termination layer material and said second conductive termination layer material so as to form a gap therebetween along a portion of said at least one edge of both said first and second electrode layers, so that said current path includes a current loop area formed from said first conductive termination layer through said plurality of first electrode layers and plurality of second electrode layers to said second conductive termination layer which cooperates with an associated circuit board for forming respective current cancellation pathways, for lowering equivalent series inductance of said component.

33. A method of making a multilayer electronic component as in claim 32, further including minimizing terminal layer material spacing at said gap so as to provide reduction in equivalent series inductance of said component as said gap is reduced.

34. A method of making a multilayer electronic component as in claim 32, further including minimizing terminal layer material spacing at said gap for minimizing such gap but without overlap of respective extended length tab connections, so as to provide relative reduction in equivalent series inductance of said component while improving high frequency performance of said component.

35. A method of making a multilayer electronic component as in claim 32, wherein said multilayer electronic component comprises a vertically oriented, multilayer ceramic decoupling capacitor.

36. A method of making a circuit board combination, comprising:

providing a multilayer electronic component as in claim 35;

providing a circuit board;

forming a plurality of conductive traces on a same side of said circuit board, and configured so as to respectively engage said first conductive termination layer material and said second conductive termination layer material;

forming a first conductive plane in said circuit board;

forming a second conductive plane in said circuit board; and forming a plurality of conductive vias through said circuit board and configured to couple respectively said respective first and second conductive termination layer materials with said conductive planes formed in said circuit board.

37. A method of making a circuit board combination as in claim 35, wherein:
providing said first conductive layer material as one of a power or signal path; and
providing said second conductive layer material as a ground plane.

38. A method of making a multilayer electronic component as in claim 29, wherein said forming at least one edge tab portion includes selectively configuring such edge tab portions so as to respectively extend along at least two edges of said insulative layer first surface with which it is associated.

39. A method of making a multilayer electronic component as in claim 29, further comprising providing at least a second extended length tab connection extending respectively from each of said conductive layer main electrode area to at least one edge of its respective insulative layer first surface, so as to provide dual access to each respective conductive layer so as to provide relatively reduced equivalent inductance of said component.

40. A method of making a multilayer electronic component as in claim 39, further comprising forming at least one edge tab portion on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat.

41. A method of making a multilayer electronic component as in claim 29, wherein:
providing said multilayer electronic component as a vertically oriented, multilayer ceramic dual capacitor decoupling multiple electrode capacitor;
providing each of said first and second electrode layers at least two respective edge tab portions formed on each of said respective insulative layers and electrically isolated from said main electrode area of said respective first and second conductive layers with which it is associated, and which are selectively configured so as to respectively extend along at least two edges of said insulative layer first surface with which it is associated, each of said tab portions providing an edge nucleation area for formation of termination material thereat; and
providing said multilayer electronic component with a plurality of respective third and fourth electrode layers, with each third electrode layer comprising a third insulative layer having first and second surfaces thereof bounded by four edges and a third conductive layer covering a portion of said first surface of said third insulative layer and having a main electrode area and at least two extended length tab connections extending from said third conductive layer main electrode area to at least two respective edges of said third insulative layer first surface, and with each of said plurality of fourth electrode layers alternately stacked with said plurality of third electrode layers and comprising mirror images thereof, each fourth electrode layer comprising a fourth insulative layer having first and second surfaces thereof bounded by four edges and a fourth conductive layer covering a portion of said first surface of said fourth insulative layer and having a main electrode area and at least two respective extended length tab connections extending from said fourth conductive layer main electrode area to at least two edges of said fourth insulative layer first surface.

42. A method of making a multilayer electronic component as in claim 41, further comprising forming at least one edge tab portion on each of said respective third and fourth insulative layers and electrically isolated from said main electrode area of said respective third and fourth conductive layers with which it is associated, and which are selectively configured so as to respectively extend along at least one edge of said insulative layer first surface with which it is associated, each of said tab portions providing an edge nucleation area for formation of termination material thereat.

43. A method of making a circuit board and electronic component combination, comprising a multilayer land grid feedthrough vertically-oriented ceramic capacitor mounted on a multilayer printed circuit board, for effective filtering capabilities for signal level lines and decoupling of power level lines or circuit planes, and for providing controlled equivalent series resistance of such electronic component, such combination comprising:
providing a plurality of first electrode layers, each first electrode layer comprising a first insulative layer having first and second surfaces thereof bounded by four edges and a first conductive layer covering a portion of said first surface of said first insulative layer and having a main electrode area and at least one extended length tab connection extending from said first conductive layer main electrode area to at least one edge of said first insulative layer first surface;
providing a plurality of second electrode layers comprising mirror images of said first electrode layers, each second electrode layer comprising a second insulative layer having first and second surfaces thereof bounded by four edges and a second conductive layer covering a portion of said first surface of said second insulative layer and having a main electrode area and at least one extended length tab connection extending from said second conductive layer main electrode area to at least one edge of said second insulative layer first surface;
positioning said first and second electrode layers in respective alternating layers;
providing first conductive termination layer material covering portions of said first electrode layers and electrically connecting said first conductive layer of each of said plurality of first electrode layers;
providing second conductive termination layer material covering portions of said second insulative layer and electrically connecting said second conductive layer of each of said plurality of second electrode layers;
forming a plurality of conductive traces on a same side of said circuit board, and configured so as to respectively engage said first conductive termination layer material and said second conductive termination layer material;
forming a first conductive plane in said circuit board;
forming a second conductive plane in said circuit board;
forming a plurality of conductive vias through said circuit board and configured to couple respectively said respective first and second conductive termination layer materials with said conductive planes formed in said circuit board;
providing said first conductive layer material as one of a power or signal path;
providing said second conductive layer material as a ground plane;
selectively configuring said at least one extended length tab connections of said respective first and second conductive layers so as to selectively establish the effective length of respective paths to such respective conductive layers, so that a current path is formed from said first conductive termination layer through said plurality of first electrode layers and plurality of second electrode layers to said second conductive termination layer which cooperates with said circuit board for forming respective current pathways having controlled equivalent series resistance for said component; and forming at least one edge tab portion on each of said respective insulative layers and electrically isolated from said main electrode area of said respective first and second conductive layers with which it is associated, and which are selectively configured so as to respectively extend along at least one edge of said insulative layer first surface with which it is associated, each of said tab portions providing an edge nucleation area for formation of termination material thereat;

wherein said forming at least one edge tab portion includes selectively configuring each of such edge tab portions so as to be respectively electrically connected in parallel with said at least one extended length tab connection of said insulative layer first surface with which it is associated, so as to relatively lower the equivalent resistance of such extended length tab connection.

44. A method of making a circuit board and electronic component combination as in claim 43, further including configuring said first conductive termination layers and said second conductive termination layers so as to form a gap therebetween along a portion of said at least one edge of both said first and second electrode layers, so that a current loop area is formed from said first conductive termination layers through said plurality of first electrode layers and plurality of second electrode layers to said second conductive termination layers which cooperates with said conductive traces, said conductive vias, and said conductive planes, for forming respective current cancellation pathways, for lowering equivalent series inductance of said component, with said terminal layer material spacing minimized at said gap so as to provide reduction in equivalent series inductance of said component as said gap is reduced.

45. A method of making a circuit board and electronic component combination as in claim 43, further including selectively configuring at least one of the length, width, and/or thickness of said at least one extended length tab connections of said respective first and second conductive layers so as to selectively establish the equivalent series resistance for said component.

46. A method of making a circuit board and electronic component combination as in claim 43, further including selectively configuring said at least one extended length tab connections of said respective first and second conductive layers so as to respectively extend to at least two edges of said insulative layer first surface with which it is associated.

47. A method of making a circuit board and electronic component combination as in claim 43, further including selectively configuring each of said at least one edge tab portions so as to respectively extend along at least two edges of said insulative layer first surface with which it is associated.

48. A method of making a circuit board and electronic component combination as in claim 43, further comprising providing at least a second extended length tab connection extending respectively from each of said conductive layer main electrode area to at least one edge of its respective insulative layer first surface, so as provide dual access to each respective conductive layer so as to provide relatively reduced equivalent inductance of said component.

49. A method of making a circuit board and electronic component combination as in claim 43, wherein:

providing said multilayer electronic component as a vertically oriented, multilayer ceramic dual capacitor decoupling multiple electrode capacitor;

providing each of said first and second electrode layers at least two respective edge tab portions formed on each of said respective insulative layers and electrically isolated from said main electrode area of said respective first and second conductive layers with which it is associated, and which are selectively configured so as to respectively extend along at least two edges of said insulative layer first surface with which it is associated, each of said tab portions providing an edge nucleation area for formation of termination material thereat; and providing said multilayer electronic component with a plurality of respective third and fourth electrode layers, with each third electrode layer comprising a third insulative layer having first and second surfaces thereof bounded by four edges and a third conductive layer covering a portion of said first surface of said third insulative layer and having a main electrode area and at least two extended length tab connections extending from said third conductive layer main electrode area to at least two respective edges of said third insulative layer first surface, and with each of said plurality of fourth electrode layers alternately stacked with said plurality of third electrode layers and comprising mirror images thereof, each fourth electrode layer comprising a fourth insulative layer having first and second surfaces thereof bounded by four edges and a fourth conductive layer covering a portion of said first surface of said fourth insulative layer and having a main electrode area and at least two respective extended length tab connections extending from said fourth conductive layer main electrode area to at least two edges of said fourth insulative layer first surface.

50. A method of making a circuit board and electronic component combination as in claim 49, further comprising forming at least one edge tab portion on each of said respective third and fourth insulative layers and electrically isolated from said main electrode area of said respective third and fourth conductive layers with which it is associated, and which are selectively configured so as to respectively extend along at least one edge of said insulative layer first surface with which it is associated, each of said tab portions providing an edge nucleation area for formation of termination material thereat.

* * * * *